United States Patent [19]

Stein

[11] Patent Number: 5,760,982
[45] Date of Patent: Jun. 2, 1998

[54] METHOD AND APPARATUS FOR TESTING MAGNETIC HEADS AND DISKS

[75] Inventor: Anatoli Stein, Los Altos, Calif.

[73] Assignee: Guzik Technical Enterprises, Inc., San Jose, Calif.

[21] Appl. No.: 595,751

[22] Filed: Feb. 2, 1996

[51] Int. Cl.$^6$ .............................. G11B 27/36; G11B 5/09; G01R 33/12

[52] U.S. Cl. .............................. 360/31; 360/51; 324/210; 324/212

[58] Field of Search .............................. 360/31, 51, 53; 324/210, 212

[56] References Cited

U.S. PATENT DOCUMENTS

| | | | |
|---|---|---|---|
| 4,578,721 | 3/1986 | Brannan, Jr. | 360/51 |
| 4,829,545 | 5/1989 | Guzik et al. | 375/120 |
| 4,967,155 | 10/1990 | Magnuson | 360/31 |
| 5,452,325 | 9/1995 | Brown et al. | 360/51 |
| 5,552,942 | 9/1996 | Ziperovich et al. | 360/51 |
| 5,663,945 | 9/1997 | Hayashi et al. | 360/46 |

OTHER PUBLICATIONS

"Phase–Locked Loops" (Selected Papers) ed. by W. C. Lindsey & C. M. Chie, pp. 3 to 25 (IEEE Press, New York, 1986).

Handbook of Filter Synthesis by A. I. Zverev, pp. 1–3, (Wiley 1967).

*Primary Examiner*—Aristotelis M. Psitos
*Assistant Examiner*—Regina Y. Neal
*Attorney, Agent, or Firm*—David Pressman; John S. Heyman

[57] ABSTRACT

An apparatus for testing magnetic heads and disks comprises a phase locked loop (11) with a phase detector (13) formed by an analog-to-digital converter (40) and a digital-to-analog converter (50). A sine wave signal is supplied to an analog input of an ADC (40) and raw data pulses are supplied to the clock input the of ADC. A phase detector (13) detects deviations in the positions of raw data pulses from the zero crossings of the sine wave signal. A PLL (11) locks in the locations of the zero crossings of the sine wave signal and ADC samples constitute instantaneous values of a bit-shift distribution. These values are processed by a DSP (70). The resulting bit-shift distribution is generated during one disk revolution.

12 Claims, 4 Drawing Sheets

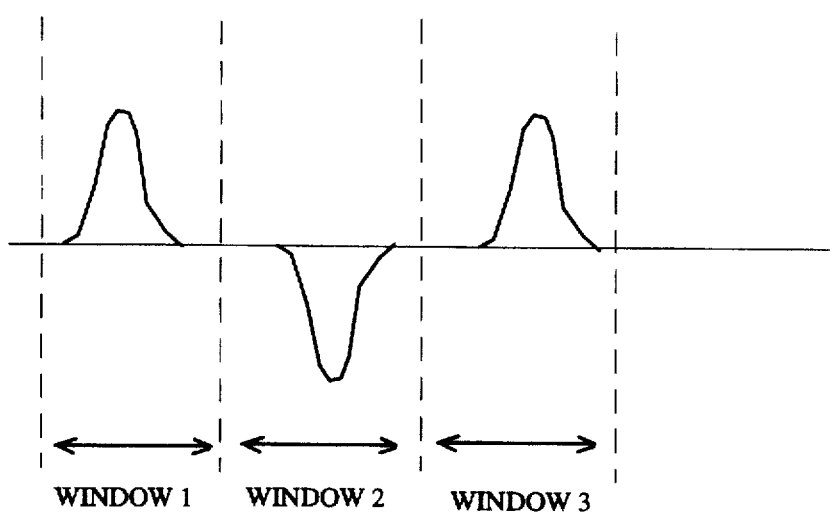
FIG. 1 -- Prior Art

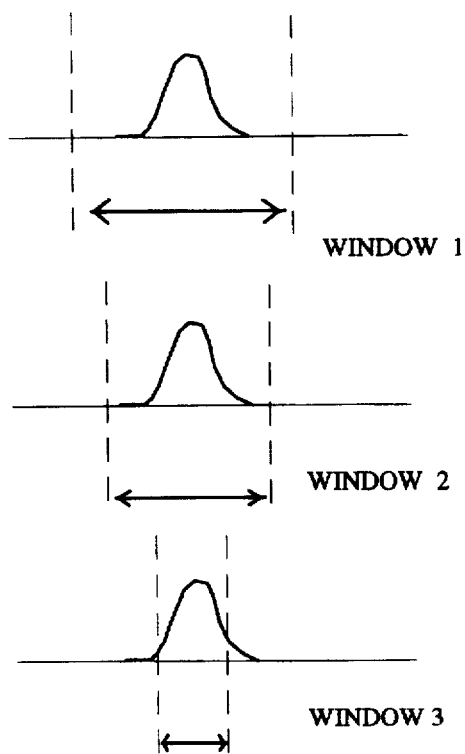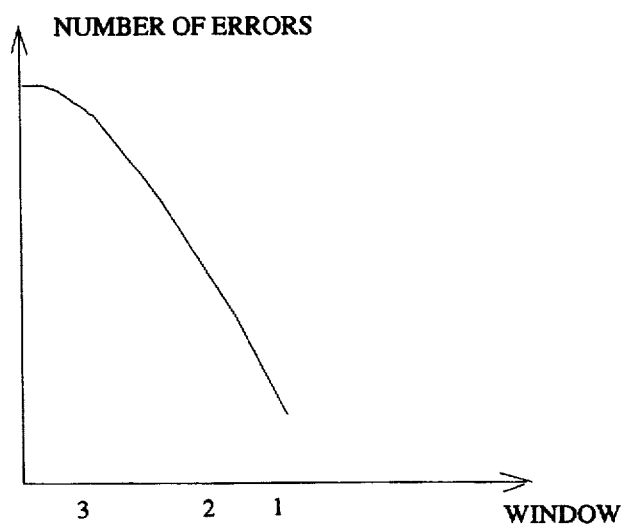
FIG. 2A -- Prior Art  FIG. 2B -- Prior Art

METHOD AND APPARATUS FOR TESTING MAGNETIC HEADS AND DISKS

BACKGROUND—FIELD OF INVENTION

The present invention relates to the field of magnetic writing and reading of information, particularly to a method and apparatus for testing magnetic heads and disks.

BACKGROUND—DESCRIPTION OF PRIOR ART—FIGS. 1 AND 2

Disk drives are magnetic data storage devices having one or morel flat magnetic disks or media with a common axis of rotation. Information is stored on the disks in circular concentric tracks and is written and read from the disks using magnetic read-and-write heads.

During the writing process, an alternating current is supplied to the head and this creates a changing magnetic field adjacent the head. This changing magnetic field, in turn, cause changes in magnetization of the magnetic medium adjacent the head. As the magnetic disk rotates, the magnetized area on the disk forms a circular track of changed magnetization. These changes of magnetization remain stored on the disk unless they are erased or overwritten when new information is recorded. The whole surface of the magnetic disk is utilized by moving the magnetic head to different radial positions, and writing on respective tracks at these positions. The tracks are separated by distances sufficient to insure that the data written on adjacent tracks will not interfere with each other or be destroyed during the writing and reading processes.

During the reading process, the magnetic head is positioned over a selected track of information. The changes in magnetization, previously written and stored on the medium, induce voltage pulses in the reading head , and these pulses are detected and decoded by disk drive circuitry. This process is known as reading the information from the disk.

Each of the voltage pulses coming from magnetic head has a limited time interval in which it can be detected. This time interval is known as a detection window and is determined by the distance between two consecutive pulses. It is set so as to distinguish between the previous and the next pulses coming from the head, as schematically shown in FIG. 1. More specifically, the detection window is set at half-distance between each of two consecutive pulses. If a voltage pulse is detected inside the detection window, the operation of the disk drive will be correct. However, if due to some reason (noise, media, or head defects) this pulse is shifted to the neighboring detection window, a data error occurs.

Prior to assembling into computers or other data-processing apparatuses, hard disks and read-write heads of computer disk drives are usually inspected and checked for various characteristics, such as signal-to-noise ratio, pulse width, pulse asymmetry, etc. An error rate, the most universal indicator of the overall quality of the disk-drive components, is also checked.

Physically, an error rate is a number of errors allowable for a particular drive assembly during its operation. For hard disks, an error rate is a ratio of the number of errors to a given number of bits written on the disk. For reliable operation of the disk, the error rate should be less than one error per $10^9$ or $10^{10}$ bits of the recorded information.

Since the direct counting of absolute errors for such a huge number of bits requires an extremely long period of time, the error rate is usually evaluated indirectly, e.g., by probability methods, such as a bit-shift phase margin method disclosed in U.S. Pat. No. 4,578,721, issued in 1986 to Brannan, Jr. This method is based on changing the widths of windows in a data separator and counting the number of data pulses which fall beyond the prescribed detection windows. The bit-shift method makes it possible to determine the dependence of the number of errors on the data window width and thus to extrapolate the relationship to the actual window width. This enables an actual error rate for the object being tested to be estimated in a relatively short period of time.

A data separator applicable to testing magnetic disk drives is disclosed in U.S. Pat. 4,829,545 issued in 1989 to N. Guzik. This patent teaches a method and apparatus for data window centering inside the detection window. The method is realized by providing a multifrequency data separator with a phase comparator emulator and a counter. The incoming raw data pulses are accurately assigned to corresponding detection windows. The size of a detection window is changed so that it is gradually reduced during the detection process, thus increasing the number of errors. This process is schematically illustrated in FIG. 2. Three decreasing detection windows are shown. A relatively small number of errors is detected for window 1, while increasing number of errors are detected for windows 2 and 3. The results of these changes are plotted as the number of errors versus the width of the detection window. The resulting plot is called a window margin or a bit-shift plot. At the present time the bit shift method finds wide application in testing and evaluating performance of disk drives, magnetic heads, and media.

Although the bit-shift system operates satisfactory as a whole and was quite advanced when it was introduced, the current development of fast digital circuitry makes it possible to further improve the bit-shift technique. For example, the method of bit-shift testing described in the prior art is based on analog principles, and requires a relatively long test time and sophisticated control of the data separator. Each measurement for a particular detection window value requires setting and adjusting parameters of data separator and takes at least one disk revolution. Therefore, if, for example, 30 measurement points are required for a bit-shift plot, the measurement process takes 30 disk revolutions. The construction of the data separator disclosed in the Guzik patent is relatively complex and requires special means to provide stability of the measurement process. Furthermore, special logic is used to detect the presence of a particular data pulse at the separator input, and the operation of the data separator depends upon the presence or absence of this pulse. This makes the construction of the device more complicated and does not allow the separator to operate at high speeds consistent with modern requirements.

OBJECT AND ADVANTAGES

It is accordingly an object of the invention to provide an apparatus for bit-shift measurements which is simple in construction, operates at high speeds to satisfy the requirements of modem technology, is based on digital principles, requires a relatively short test time, allows simple control of the apparatus, ensures stability of measurements, does not require the use of special logic for detecting the presence of a particular data pulse, and operates irrespective of the presence or absence of the aforementioned pulse. Another object is to provide a novel and improved method for bit-shift measurements.

Other advantages and features of the invention will be better understood after the consideration of the ensuing description with reference to the accompanying drawings.

DRAWINGS

FIG. 1 is a schematic representation of a pulse detection process in a conventional disk drive.

FIG. 2A and FIG. 2B illustrate diagrams of bit-shift distribution measurements in a known apparatus.

Reference Numerals

10—voltage controlled oscillator
10a—input of voltage controlled oscillator
10b—output of voltage controlled oscillator
11—phase locked loop
13—phase detector
15—signal generator
20—programmable divider
20a—input of programmable divider
20b—output of programmable divider
30—low pass filter
30a—input of low pass filter
30b—output of low pass filter
40—analog-to-digital converter
40a—analog input of analog-to-digital converter
40b—clock input of analog-to-digital converter
40c—output of analog-to-digital converter
50—digital-to-analog converter
50a—input of digital-to-analog converter
50b—output of digital-to-analog converter
60—loop filter
60a—output of loop filter
60b—input of loop filter
70—digital signal processor
70a—input of digital signal processor
70b—output of digital signal processor

SUMMARY

In accordance with the invention, an apparatus for testing magnetic heads and disks has a phase locked loop with a phase detector formed by an analog-to-digital converter (ADC) connected in series with a digital-to-analog converter (DAC). A sine wave signal is supplied to an analog input of ADC, while raw data pulses are supplied to the clock input of ADC. The ADC output constitutes digital samples of the phase error. This phase error is proportional to the time shifts between the raw data pulses and the zero crossings of the sine wave signal on the analog input of the ADC. These phase error values are transformed back into analog voltage by DAC and constitute control signal of the phase locked loop. Instantaneous values of ADC samples are processed by a digital signal processor. This results in generating a bit-shift distribution. One revolution of the disk is sufficient for obtaining such a bit-distribution.

FIG. 3—DESCRIPTION OF THE HEAD TESTER

Figure 3:
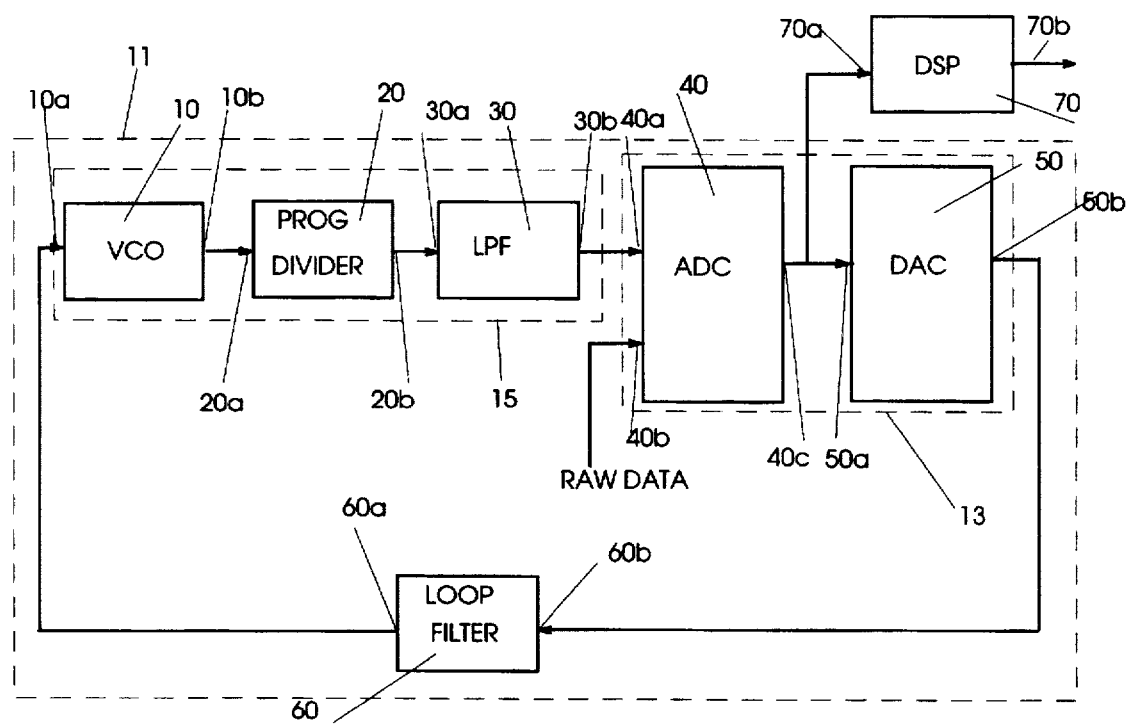
FIG. 3 is a block diagram of an apparatus of a bit shift measurement system of the invention.

An apparatus suitable for the realization of the method of the invention is shown in FIG. 3 in block diagram form. The apparatus consists of a voltage controlled oscillator (VCO) 10, connected in series with a programmable divider 20, a low-pass filter (LPF) 30, an analog-to-digital converter (ADC) 40, a digital-to-analog converter (DAC) 50, and a loop filter 60. The output 60a of loop filter 60, in turn, is connected to the input 10a of VCO 10. ADC 40 has an analog input 40a, a clock input 40b to which special raw data pulses are supplied from a clock generator (not shown), and an output 40c. The latter is connected to an input 70a of a (DSP) 70.

VCO 10 is a unit which generates on its output a signal whose frequency is dependent upon its input signal. The higher the voltage level on the input 10a of VCO 10, the greater the value of frequency generated on its output 10b. The output of VCO 10 is used as an input for programmable divider 20. Preferably VCO 10 produces an output from 200 MHz to 400 Mhz, depending upon its input voltage. VCO 10 is a standard module, for example, such as module Q3500 produced by Qualcomm Inc., 10555 Sorrento Valley Road, San Diego, Calif. 92121.

Programmable divider 20 is a unit which divides the frequency of its input signal so that the signal on its output has a reduced frequency. This reduced frequency is the input frequency supplied to the divider divided by a programmed division coefficient. For example, if the input frequency to the divider is 500 MHz and the division coefficient is 5, the output frequency of the divider is 100 MHz. Programmable divider is also a standard module, for example, MC10E016, produced by Motorola Inc., P.O. Box 20912, Phoenix, Ariz. 85036.

Output 20b of programmable divider 20 is connected to input 30a of LPF 30. A LPF is a device that rejects the signal frequencies which are higher than a particular cutoff frequency. For example, if the cutoff frequency of the filter is 50 MHz, and the input signal has frequencies up to 100 MHz, the filter output will have frequencies only up to 50 MHz. LPFs are common and are described in detail in numerous references, for example, in A. Zverev, Handbook of Filter Synthesis, John Wiley & Sons, N.Y., 1967.

VCO 10, programmable divider 20, and LPF 30 together form a signal generator 15 which generates a periodic signal with a frequency dependent upon its input signal. Input 10a of VCO 10 consititutes a signal generating input, and output 30b of LPF 30 constitutes a centering signal generating output.

Output 30b of LPF 30 is connected to an analog input 40a of ADC 40. ADC 40 has a second clock input 40b and takes digital samples of the analog input when a voltage pulse is supplied on its clock input 40b. Thus, once a clock signal appears on clock input 40b of ADC 40, a digital value corresponding to the current voltage level of the analog input appears on ADC output 40c. For an 8-bit ADC, these voltage levels may take values from 0 to 255, where 0 corresponds to a minimum voltage value and 255 to a maximum voltage value. The clock input of ADC 40 is taken from the raw data pulses, generated by a disk drive detection circuit (not shown). These raw data pulses coincide with the peaks of detected voltage pulses coming from the disk drive (not shown) and are standard part of any disk drive or disk drive testing equipment. For example, they can be generated by a Guzik 1601 Read-Write Analyzer, produced by Guzik Technical Enterprises, 4620 Fortran Drive, San Jose Calif. 95134. ADC 40 is a standard module, for example model TDA8718, produced by Philips, 5600 JA, Eindhoven, Netherlands.

Output 40c of ADC 40 is connected to input 50a of DAC 50. DAC 50 performs a function which is inverse to that of the ADC, i.e. it transforms the digital value on its input to an analog voltage value on its output 50b. DAC 50 is also a standard module, for example, model TLC7528, produced by Texas Instruments, P.O. Box 655303, Dallas, Tex. 75265-5303.

ADC 40 and DAC 50 are connected in series and constitute a phase detector 13.

Output 40c of ADC 40 is also connected to an input 70a of DSP 70. DSP 70 is a standard module, for example, model DSP TMS320750, produced by Texas Instruments, P.O. Box 655303, Dallas, Tex. 75265-5303. DSP 70 receives digital data from output 40c of ADC 40 and performs necessary calculations which will be described later.

Output 50b of DAC 50 is connected to input 60b of loop filter 60. Loop filter 60 is in fact a LPF, similar to LPF 30. It rejects frequencies above its cutoff frequency and provides a function similar to integration of a signal. Output 60a of loop filter 60 is supplied to input 10a of VCO 10.

VCO 10, programmable divider 20, LPF 30, ADC 40, DAC 50, and loop filter 60 are connected in series and constitute a phase locked loop (PLL) 11. A PLL is a device which locks the frequency of an oscillator in phase with the frequency of an external source. PLL modules are well known in the art. The theory of their operation is described, for example, in "Phase Locked Loops", Ed. by W. C. Lindsey and C. M. Chie., IEEE Press, 1986, the Institute of Electrical and Electronics Engineers, Inc., 345 East 4th Street, New York, N.Y. 10017-2394.

FIGS. 3 AND 4—OPERATION OF HEAD TESTER

The head tester operates as follows:

In a standby mode, when no raw data pulses are supplied to clock input 40b of ADC 40, VCO 10 generates a sine wave signal with working frequency f, e.g. of 200 MHz. This frequency is divided in programmable divider 20, whereby a sequence of rectangular pulses with a period of f/K, where K, a coefficient of programmable divider 20, appears on output 20a of divider 20. As is well known from the theory of spectral analysis, a spectrum of a sequence of rectangular pulses consists of a number of harmonics at frequencies proportional to f/K, i.e., f/K, 2f/K, 3f/K, etc. (See Paul M. Embree, Bruce Kimbie, C Language Algorithms for Digital Signal Processing, Prentice Hall, Englewood Cliffs, N.J. 07632, 1991). LPF 30 rejects all harmonics higher than its cutoff frequency fc. Therefore, if the LPF's cutoff frequency is chosen between f/K and 2f/K, a sine wave signal with frequency f/K will be present on output 30b of filter 30.

Figure 4:
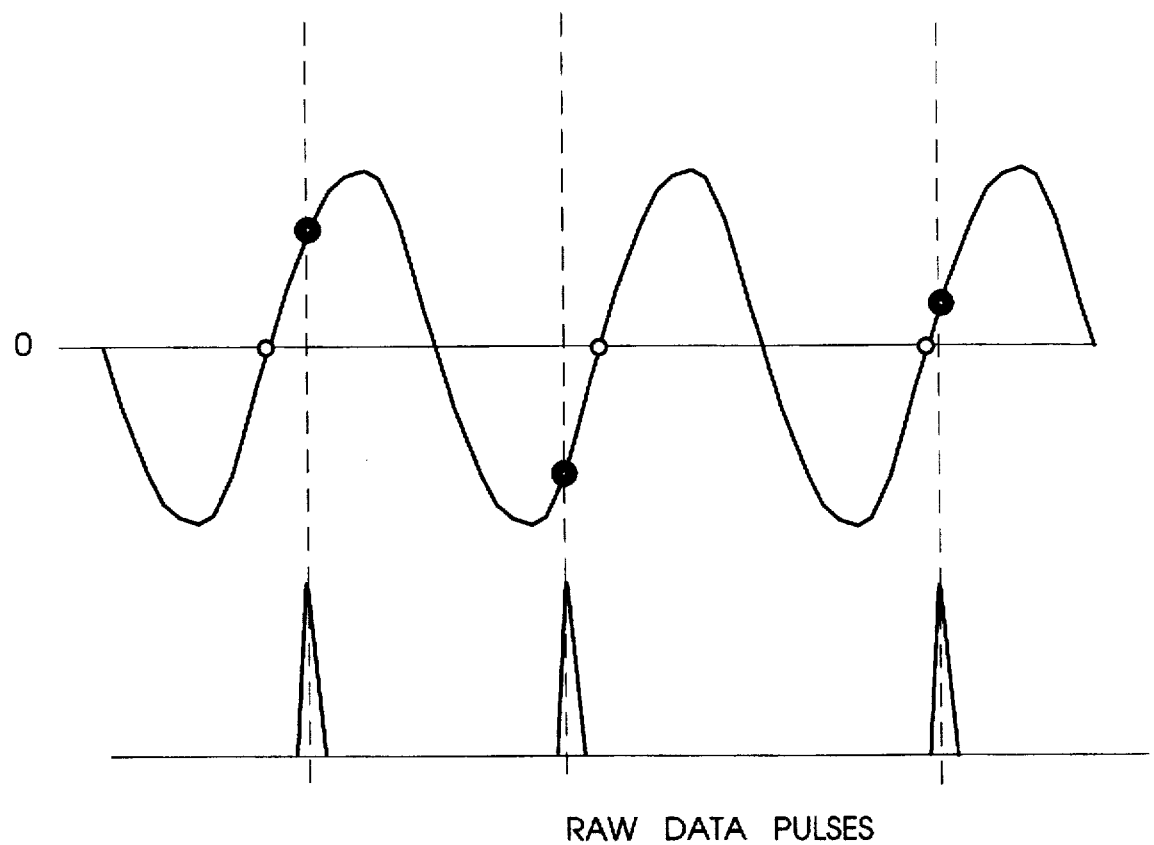
FIG. 4 is a schematic representation of a sampling process according to the method of the invention.

When at which a raw data pulse is supplied to input 40b of ADC 40, a digital value corresponding to the signal level appears on ADC output 40c. Once a raw data pulse appears, ADC output 40c equals the digital value of the sine wave at the corresponding location of the raw data pulse. This process is schematically illustrated in FIG. 4. Raw data pulses are shown on the bottom part and the corresponding sine wave signal is shown on the top. Light circles correspond to the locations of zero crossing, while heavy circles correspond to the sine wave values at the locations of the raw data pulses. As seen, the corresponding digital value depends upon the distance between the instant at which the raw data pulse appears on the clock input 40b of ADC 40 and the instant of time in which the sine wave on analog input 40a of ADC 40 crosses its zero level. The closer the raw data pulse to the instant of time in which the sine wave crosses its zero level, the smaller the value of the sine wave signal and the corresponding digital value on ADC output 40c. This digital value is transformed back into an analog voltage level by DAC 50. In this way, the combination of ADC 40 and DAC 50 constitutes a phase detector 13. A phase detector is a device which has two inputs and one output and generates on its output a voltage level which is proportional to the phase difference between its two inputs. This phase difference is exactly the distance between the zero crossing of sine wave on analog input 40a of ADC 40 and the raw data pulse on clock input 40b of ADC 40, which is digitized by ADC 40 and is transformed back in an analog voltage level by DAC 50.

The output signal of DAC 50 is filtered by loop filter 60 and the output signal of loop filter 60 is supplied to input 10a of VCO 10. As some voltage level appears on input 10a of VCO 10, it changes the frequency on its output 10b. Since the level of voltage on input 10a of VCO 10 is proportional to the distance between the zero crossing of sine wave on analog input 40a of ADC 40 and the incoming raw data pulse, the system will tend to stabilize exactly at the location of the sine wave's zero crossings. It means that the frequency of VCO 10 is adjusted in such a way that incoming raw data pulses coincide with the locations of centering signals. As shown in FIG. 3, the centering signal has periodic zero crossings of the sine wave on analog input 40a of ADC 40. This is because output signal of phase detector 13 constitutes a signal proportional to the phase difference of the incoming raw data pulse and the zero crossings of the sine wave. Therefore PLL 11 locks in these zero crossings locations. In the PLL of the invention, the oscillator is VCO 10, the external source is determined by raw pulses supplied to the clock input of ADC 40, and the phase detector is a combination of ADC 40 and DAC 50.

While the PLL of FIG. 3 is in a normal mode of operation, it is stabilized and the VCO's frequency follows the raw data pulses. In this case, the zero crossings of sine wave on analog input 40a of ADC 40 on average coincide with the positions of raw data pulses on clock input 40b of ADC 40. Any instantaneous instabilities of raw data pulses, caused by media and electronic noise, media defects, or head noises, will result in deviation of raw data pulses from their ideal positions. Therefore, instantaneous digital values on the output of ADC 40 are proportional to the distances between the ideal positions of raw data pulses and their current positions. It means that these digital values can be detected in real time from output 40c of ADC 40 and will constitute instantaneous bit-shift values.

To obtain a bit-shift distribution, these instantaneous values are processed by DSP 70. More specifically, DSP 70 calculates a histogram of these values. This histogram is a function which characterizes the probability of meeting each particular value of the bit-shift and it appears on output 70b of DSP 70.. Therefore, the bit-shift distribution can be obtained during one disk revolution.

DSP 70 is programmed in macrocode program language for DSP model TMS320 to calculate the bit-shift distribution. The following is the listing of a suitable program:

```
% SMPL - current value of ADC output
% N - total number of pulses written on the track
% BS - resulting bit-shift distribution
BS=0;
% Initialize bit-shift distribution array
for i=1 to N;
% repeat operation from first to last pulse of raw data
    SMPL=input(ADC);        % read current ADC value
    BS(SMPL)=BS(SMPL)+1;    % Calculate bit-shift
    end;
```

The output of this program is an array of bitshift values BS. This array of values appears on output 70b of DSP 70 and constitute a sequence of integer numbers characterizing the probability of meeting each particular value of the bitshift. For example, a sequence of numbers {1000, 500, 300, 100, 50} means that zero value of bitshift was met 1000 times, a bitshift equal to 1 was met 500 times, etc.

SUMMARY, RAMIFICATIONS, AND SCOPE

Thus the method and apparatus of the invention is able to calculate the bit-shift distribution during one disk revolution, is based on digital circuitry, is fast, reliable, and does not require a data separator with a sophisticated construction.

While the tester has been shown and described with reference to specific embodiments, it is not limited to these embodiments. For example, more than one LPF 30 can be used to provide sine wave signals with different frequencies on the input of ADC 40. Also filter 30 may be programmed with a variable cutoff frequency. In another possible embodiment, programmable divider 20 and filter 30 may be replaced by a ramp generator, which produces a ramp signal (instead of a sine wave) on the analog input of ADC 40. To provide flexibility, a special phase frequency detector can be added to the system to provide initial frequency lock of VCO 10 with raw data pulses. A special chip for histogram calculation can be connected to the digital output of ADC 40 instead of DSP 70. Numerous other ramifications are possible.

Therefore, the scope of this invention should be determined, not by the given examples, but by the claims and their legal equivalents.

What is claimed is:

1. A method for testing magnetic head and disks containing stored information, comprising the steps of: providing a phase locked loop which includes;

a signal generating means having a control input and an output, the frequency at said output being dependent upon the level of a signal supplied to said input, said output being a periodic analog signal having zero crossing points;

a phase detector consisting of;
      an analog-to-digital conversion means which has an analog input, a clock input, and an output, said analog input being connected to said output of said signal generating means; and
      a digital-to-analog conversion means having an input and an output, said input directly connected to said output of said analog-to-digital conversion means said output being connected to said input of said signal generating means;

providing a digital data processing means having an input connected to said output of said analog-to-digital conversion means;

reading information stored on said magnetic disk and transforming said information into raw data pulses;

supplying said analog signal, generated by said signal generating means, to said analog input of said analog-to-digital conversion means;

supplying said raw data pulses to said clock input of said analog-to-digital conversion means and obtaining digital data representing the deviation between said raw data pulses and said zero crossing points of said analog signal from said generating means on said output of said analog-to-digital conversion means;

converting said digital data from said output of said analog-to-digital conversion means to analog voltage levels by said digital-to-analog conversion means;

automatically adjusting the frequency of said analog signal from said generating means as a function of said digital data by supplying said analog voltage levels from said output of said digital-to-analog conversion means to said control input of said signal generating means; and generating a bit-shift distribution by processing said digital data in said digital data processing means.

2. The method of claim 1 wherein said signal generating means comprises the following elements connected in series: a voltage-controlled oscillator, a programmable divider, and a low-pass filter.

3. The method of claim 1 wherein said digital data processing means comprises a digital signal processor.

4. The method of claim 3 wherein said signal generating means comprises the following elements connected in series: a voltage-controlled oscillator, a programmable divider, and a low-pass filter.

5. A method for testing magnetic heads and disks, comprising the steps of:

providing a phase locked loop, said phase locked loop having phase detector means and signal generating means connected in series, said phase detector means consisting of an analog-to-digital converter and a digital-to-analog converter directly connected in series, said phase detector means having an analog input, a clock input, and an analog output;

reading information, stored on a magnetic medium and transforming said information into raw data pulses;

supplying said raw data pulses to said clock input of said phase detector means;

supplying a centering signal generated by said signal generating means to said analog input of said phase detector means;

providing digital data at said analog-to-digital converter representing the phase difference between said raw data pulses and said centering signals of said generating means, and then converting said digital data to said analog output at said digital-to-analog converter;

supplying said analog output of said phase detector means to an input of said signal generating means for automatically locking in said centering signals to said raw data pulses as a function of said digital data, and processing said digital data in a digital data processor means, thus generating a bit-shift distribution.

6. The method of claim 5 wherein said signal generating means comprises the following elements connected in series: a voltage-controlled oscillator, a programmable divider, and a low-pass filter.

7. The method of claim 5 wherein said digital data processing means comprises a digital signal processor.

8. The method of claim 7 wherein said signal generating means comprises the following elements connected in series a voltage controlled oscillator, a programmable divider, and a low-pass filter.

9. An apparatus for testing magnetic heads and disks, comprising:

a phase locked loop including;
      a signal generating means having a control input and an output and arranged to supply at said output a centering signal having a frequency dependent upon the level of a signal supplied to said input, said output signal being a periodic analog signal having zero crossing points;
      a phase detector consisting of;
         an analog-to-digital conversion means which has an analog input, a clock input, and an output, said analog input of said analog-to-digital conversion means being connected to said output of said signal generating means, said clock input supplied by raw data pulses from said magnetic heads and disks, said output providing digital data representing the phase difference between the raw data pulses and said zero crossing points of said analog signal from said generating means; and a digital-to-analog conversion means having an input and an output, said digital data output of said analog-to-digital conversion means being directly connected to said input of said digital-to-analog conversion means;

a loop filter connected between said analog output of said digital-to-analog conversion means and said control input of said signal generating means, so that a filtered analog output automatically adjusts said zero crossing points of said analog signal from said generating means to be in phase with said raw data pulses as a function of said digital data; and a digital data processing means connected to said output of said analog-to-digital conversion means for providing bit-shift distribution information.

10. The apparatus of claim 9 wherein said signal generating means comprises the following elements connected in series: a voltage-control oscillator, a programmable divider, and a low-pass filter.

11. The apparatus of claim 10 wherein said digital data processing means comprises a digital signal processor.

12. An apparatus for testing magnetic heads and disks, comprising:

a phase locked loop including;

a voltage controlled oscillator having an input and an output, the frequency on said output being dependent upon the signal level supplied to said input;

a programmable divider having an input and an output, said programmable divider connected to said output of said voltage controlled oscillator;

a low-pass filter having an input and an output, said input connected to said output of said programmable divider;

a phase detector consisting of;

an analog-to-digital conversion means having analog input, a clock input, and a digital output, said analog input of said analog-to-digital conversion means being connected in series with said output of said low-pass filter, said clock input supplied by raw data pulses from said magnetic heads and disks, said digital output providing digital data representing the phase difference between said raw data pulses and said low pass filter output; and a digital-to-analog conversion means having a digital input and an analog output, said digital input of said digital-to-analog conversion being directly connected in series with said digital output of said analog-to-digital conversion means;

a loop filter connected between said analog output of said digital-to-analog conversion means and said input of said voltage controlled oscillator so that a filtered analog output automatically adjusts said output frequency of said voltage controlled oscillator to be in phase with said raw data pulses as a function of said digital data; and a digital data processor means connected to said output of said analog-to-digital conversion means.

* * * * *

UNITED STATES PATENT AND TRADEMARK OFFICE
CERTIFICATE OF CORRECTION

PATENT NO.:    5,760,982
DATED:         JUN 2, 1998
PATENTEES:     ANATOLI STEIN

It is certified that error appears in the above-identified patent and that said Letters Patent is hereby corrected as shown below:

Col. 1, line 13, change "more1" to —more—.

Signed and Sealed this

Twenty-first Day of July, 1998

*Attest:*

BRUCE LEHMAN

*Attesting Officer*      Commissioner of Patents and Trademarks